United States Patent [19]

Balderes et al.

[11] 4,233,645
[45] Nov. 11, 1980

[54] SEMICONDUCTOR PACKAGE WITH IMPROVED CONDUCTION COOLING STRUCTURE

[75] Inventors: Demetrios Balderes, Wappingers Falls; John R. Lynch, Hopewell Junction; Robert A. Yacavonis, Poughkeepsie, all of N.Y.

[73] Assignee: International Business Machines Corporation, Armonk, N.Y.

[21] Appl. No.: 947,788

[22] Filed: Oct. 2, 1978

[51] Int. Cl.$^3$ ............................................. H05K 7/20
[52] U.S. Cl. ..................................... 361/385; 361/386; 174/16 HS
[58] Field of Search ......................... 361/382, 385–387; 357/82; 165/32, 104 M, 105; 174/15 HP, 15 R, 16 HS

[56] References Cited

U.S. PATENT DOCUMENTS

| 4,000,776 | 1/1977 | Kroebig | 165/105 |
| 4,118,756 | 10/1978 | Nelson | 165/105 |

FOREIGN PATENT DOCUMENTS 1365448 9/1974 United Kingdom ...................... 357/82

OTHER PUBLICATIONS

Metal Wool Heat Stud, Ronkese, IBM Tech. Discl. Bull., vol. 20, No. 3, Aug. 1977, p. 1122.
Cooling Device for Multilayer Ceramic Modules, Clark, IBM Tech. Discl. Bull. vol. 20, No. 5, Oct. 1977, p. 1769.
Device Cooling, Johnson, IBM Tech. Discl., vol. 20, No. 10, Mar. 1978, p. 3919.
Conduction Cooling Module, Hwang, IBM Tech. Discl. Bull., vol. 20, No. 11A, Apr. 1978, p. 4334.
Liquid Encapsulated Conduction Module, Hwang, IBM Tech. Discl. Bull., vol. 20, No. 7, Dec. 1977, p. 2759.

Primary Examiner—Gerald P. Tolin
Attorney, Agent, or Firm—Wolmar J. Stoffel

[57] ABSTRACT

A semiconductor device package having a substrate, one or more semiconductor devices mounted on the top surface of the substrate, a heat sink having a surface in opposed spaced parallel relation to the top surface of the substrate, and at least one deformable heat transfer member positioned between a device mounted on the top surface of the substrate, and the surface of the heat sink. The heat transfer member is comprised of a porous block of material, and a heat conductive non-volatile liquid retained within the block of material by a surface tension. The heat transfer member being operative to transfer heat from the device to the heat sink.

1 Claim, 5 Drawing Figures

SEMICONDUCTOR PACKAGE WITH IMPROVED CONDUCTION COOLING STRUCTURE

TECHNICAL FIELD

This invention relates to conduction cooling of small heat-generating electronic devices and, more particularly, to the cooling by conduction of miniaturized electronic devices in an encapsulated enclosure.

One object of the present invention is to provide an improved cooling scheme having low thermal impedance for conducting heat from a heat-generating electronic device mounted on a substrate to a heat sink.

Another object of this invention is to provide an improved cooling structure for a semiconductor package wherein the thermal impedance between the device and a heat sink is reduced by providing a liquid material which intimately contacts the surface of the device and the cooling sink and which is maintained in place by a porous block of material.

Another object of the present invention is to provide in a semiconductor package an improved cooling structure which includes a liquid for at least contacting the heat-generating element located in a sealed enclosure, wherein the liquid is held in a porous material which prevents potential contamination of associated devices and metallurgy on the substrate or associated heat-generating elements.

Still another object of this invention is to provide in a semiconductor package an improved conduction cooling scheme wherein a liquid is maintained in intimate contact with a heat-generating element to thereby reduce the thermal resistance at the interface whereby the liquid is maintained in position by capillary action in a block of porous material, which also acts as a reservoir for the liquid.

BACKGROUND ART

With the seemingly unlimited electronic capabilities afforded by the discovery of solid state electronics, the microminiturization has been extended. This has resulted in the need for various improved techniques for dissipating the heat generated by the solid state components. In modern high density semiconductor packaging technology, it is necessary to transfer heat from the surface of the heat semiconductor element to a heat sink at a rate sufficiently high to limit the increase in the temperature of the semiconductor material. The standard forced air cooling appears to have reached its limit of practicality in that the amount of air that is required to provide sufficient cooling for the limited heat dissipating surfaces of the devices introduces a noise problem, and without some auxiliary techniques cannot maintain each of a large number of components within its critical, narrow operating temperature range. In general, it is desirable to maintain the semiconductor devices at or above 20° C. but at or below 85° C. This temperature range or, on occasions, even a narrower temperature range is required by circuit designers to keep the operating parameters of the devices in designated operating ranges, and also to minimize the noise generated in a circuit by relatively cold devices.

Another and more recent technique has been the immersion cooling system wherein an array of components to be cooled are immersed in a tank of cooling liquid. The liquids used are the fluorocarbon liquids which have a low boiling point. These liquids are dielectric and boil at relatively low temperatures. Cooling systems using this principle are described and claimed in U.S. Pat. No. 3,774,677, U.S. Pat. No. 3,851,221, and U.S. Pat. No. 3,741,292. However, these types of modular liquid encapsulated schemes must meet certain inflexible requirements. For instance, it requires coolants of extremely high purity free of any contaminants. The liquid is in contact with the device surfaces as well as the substrates which contain metallurgy. Any impurities in the coolant is a potential source for corrosion of the metallurgy and can, therefore, reduce the operating life of the system. Another cooling technique involves providing a thermal conduction route from the device to a suitable heat sink wherein heat is thermally conducted through a suitable heat-conducting material having a relatively low thermal resistance. The technique is more commonly known as conduction cooling. Embodiments of conduction cooling are disclosed in U.S. Pat. No. 4,034,469, 4,034,468, and 3,993,123. In general, these embodiments employ a solid material in contact with the backside of a solder bonded device, and which may contact with a suitable heat sink. The path provided for heat conduction can be rigid, as in U.S. Pat. No. 4,034,469 or U.S. Pat. No. 4,034,468, or in the form of spring-biased pistons, as in U.S. Pat. No. 3,993,123. In all such techniques it is important that an intimate, large area, firm contact be made between the heat-conducting element and the device in order to reduce the usual relatively high thermal impedance that exists at the interface. Thermal greases have been employed for this purpose. However, with high-performance devices which operate at higher temperatures, this solution has not been entirely satisfactory. The thermal grease can, under certain conditions, move from the interface thereby increasing its thermal resistance and can also accumulate at undesirable locations in the package causing a potential contamination problem.

In order to meet the future cooling requirements for semiconductor packaging with a system that is dependable, inexpensive and efficient, a technique for decreasing the thermal impedance at the interface of a device and coldplate, or extension thereof, is needed.

BRIEF DESCRIPTION OF THE DRAWINGS

In the accompanying drawings forming a material part of this disclosure.

DISCLOSURE OF THE INVENTION

By this invention the thermal resistance of the interface between the semiconductor device or other heat producing element and a cooling element, i.e., cold plate, cooling fin, or the like, is reduced by providing a liquid medium, held in position by a block of porous material. The porous material also provides a reservoir ensuring a supply of liquid medium that is available at the interface. The liquid forms a conformable interface with both the device and the cooling element and thereby provides an efficient conduit for transfer of the heat from the device.

Figure 1:
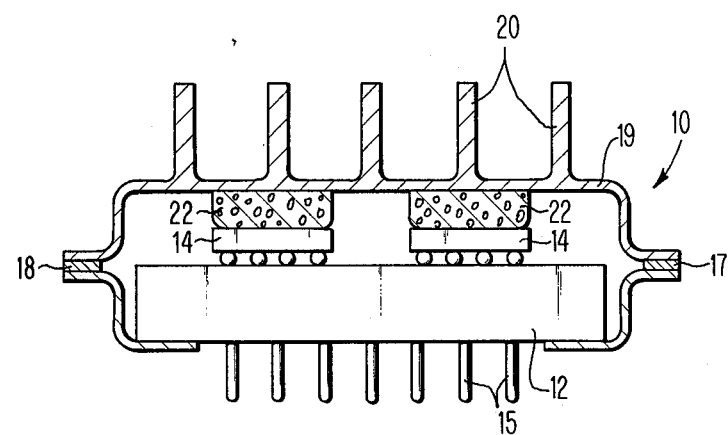
FIG. 1 is an elevational view in broken section illustrating a first embodiment of the cooling concept of the invention.

Referring now to FIG. 1 of the drawings there is illustrated in a first embodiment 10 a semiconductor package provided with a substrate 12 formed of an insulating or dielectric material which serves the function of providing electrical connections between the terminals of semiconductor devices 14 mounted thereon and pins 15, and also interconnecting other semiconductors mounted on the same substrate. Substrate 12 is typically formed of ceramic material or organic material and is provided with a metallurgy system either on the top surface or internal thereof. A preferred form of substrate, particularly when large numbers of devices are mounted thereon is known as a multilayer ceramic substrate. This substrate is produced by forming a slurry composed of particulate ceramic material, and organic binder, a solvent for the binder, and a plasticizer, doctor blading the slurry into thin sheets, forming via holes in the sheets, filling the via holes with a conductive paste and simultaneously forming electrical stripes on the surface, laminating the respective sheets into the substrate which provides the desired interconnection pattern, and sintering. The semiconductor devices 14 are preferably joined to substrate 12 by solder bonding techniques as described and claimed in U.S. Pat. Nos. 3,429,040 and 3,495,133. The pins 15 are joined to the substrate by suitable bonding techniques known in the prior art. A flange 16 is secured to the substrate 12, as for example by brazing techniques which forms a mating surface 17 which meets with a surface 18 of cover 19. Cover 19 is preferably provided with cooling fins 20. In this embodiment heat generated by devices 14 is conducted to the underside of cover 19 by blocks 22 of porous material having impregnated therein a suitable liquid. The liquid supported in the blocks 22 by capillary action forms interfaces with the devices 14 as well as the underside of cover 19.

Figure 2:
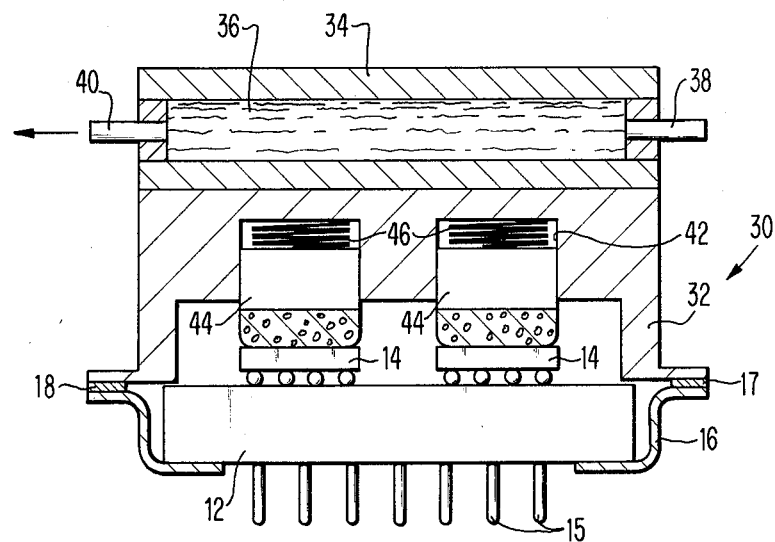
FIG. 2 is an elevational view in broken section illustrating a second embodiment of the cooling concept of the invention.

Referring now to FIG. 2 there is illustrated a second embodiment 30 using the cooling concept of the invention. Package 30 has a substrate 12 provided with pins 15 and semiconductors 14 generally similar to the embodiment illustrated in FIG. 1. A flange 16 is joined to the substrate which mates with a cover 32 having attached thereto a cold plate 34 provided with a chamber 36 in which a suitable cooling liquid is circulated through inlet 38 and outlet 40. Cover 32 is provided with cylinders 42 located over devices 14 in which are provided movable pistons 44 biased toward the device by springs 46. Positioned between each of the pistons 44 and devices 14 is a block of porous material 48. The porous material can be separable or an integral part of the piston 44. The entire piston could be porous if desired. The porous material 48 is impregnated with a suitable liquid which as in FIG. 1 forms a conforming interface with the device 14. The cover 32 is secured to the flange by the brazing, soldering or the like.

Figure 3:
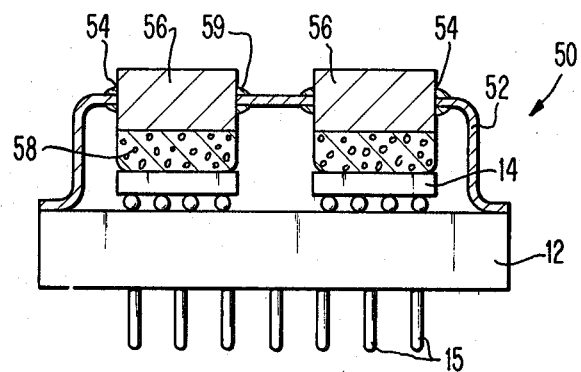
FIG. 3 is an elevational view in broken section of a third embodiment which utilizes the cooling concept of the invention.

In FIG. 3 there is illustrated a third embodiment 50 which utilizes the cooling concept of the invention. In this embodiment a suitable substrate 12 is provided with pins 15 and has devices 14 joined to the top surface as with the previously described embodiments. A cover 52 is joined to substrate 12 in any suitable fashion, as for example brazing to a metallurgy ring formed on the top surface of the substrate. Cover 52 is provided with openings 54 located over each of the devices 14 to be cooled. A plug 56 preferably of a metallic material is located in each of the openings 54 and has an end portion 58 formed of a porous material. A suitable liquid is impregnated in each of the porous material ends 58 of the plugs 56. In assembling the device after the cap has been joined into substrate 12, the plugs 56 complete with the porous material 58 and liquid are assembled, a solder ring disposed about each of the plugs, and the entire unit heated to a temperature sufficient to melt the solder which subsequently forms a hermetic seal 59 between the plugs 56 and cover 52.

In selecting the porous material and the liquid for the use in the cooling concept of the invention a number of considerations are involved. Three requirements must be satisfied in order to meet the objectives of the invention i.e. (1) the system energy must favor the liquid filling the gap between the chip and the cooling element, (2) the system capillary forces shall not be high enough to separate the fluid into two distinct drops on the chip and the cooling element, and (3) the system energy will favor the liquid staying both in the chip to cooling element gap and in the fluid reservoir formed by the porous material. In selecting the porous material and the liquid for the cooling concept of the invention a number of considerations are involved. A basic requirement is that no chemical reactions or phase changes shall occur between the elements which would detrimentally alter the physical interaction of the system. Fulfilling the aforementioned requirements entails selecting the porous material, the surface of the device, and the liquid such that the wettability of the porous material by the liquid will draw the liquid into the porous material, but this action will not be so great that the capillary action will draw the liquid away from the device surface. In general both the porous material and the device surface must be wettable. If the porous material is not wettable the liquid will not be absorbed. If the device surface were significantly more wettable than the porous material the liquid would be drawn out by the device surface. The back side of the device in contact with the porous material can be coated to provide the desired wettability in the system. Further an annular ring of nonwettable material can be deposited on the device to prevent removal of the liquid from the porous material in the event that the wettability of the device surface is significantly higher than the porous material.

Figure 4A:
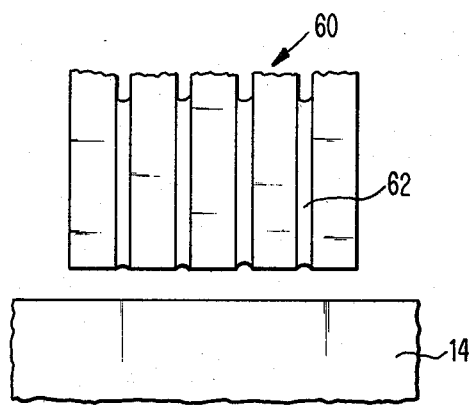
FIGS. 4A and 4B are elevational views in broken section in greatly enlarged scale which illustrates and aides in the explanation of the capillary action present in the concept of the invention.
Figure 4B:
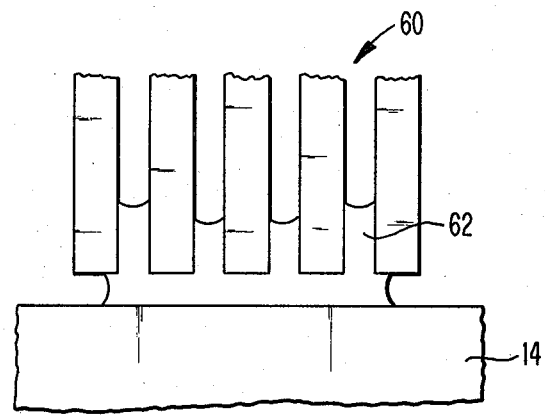

Associated with the wettability considerations is the capillary size of the porous material. Everything else being equal the smaller the capillary size the greater the force tending to draw the liquid into the material. The correlation which defines the variables of the system which assures that the system energy decreases as the device to cooling element gap is filled is as follows:

$$d > \frac{X}{A - \sqrt{X/D}} \qquad (1)$$

where d is the capillary size, X is the device to cooling element gap distance, A is a constant, V is the relative surface tension constant, and D is the diameter of the cooling element. Referring to FIGS. 4A and 4B there is illustrated schematically a device 14 in closely spaced relationship to a capillary mass of material 60 illustrated as a plurality of axially aligned capillaries. When the condition set forth in the aforedescribed correlation exists the condition illustrated in FIG. 4B exists. Note that the liquid 62 contacts the surface of chip 14. As illustrated the smaller the capillary sizes the higher the force tending to draw the liquid against the force of gravity into the capillary. The condition shown in FIG. 4A might exist if the surface tension on the device 14 is not sufficiently high to attract the liquid 62 and/or the diameter of the capillaries, taking into account the surface tension, are so small as to forceably draw the liquid therein, or the gap between the cooling element and the device is too large.

Another requirement is that the capillary forces in the porous material are not high enough to overcome the surface tension of the fluid in the device-cooling element gap. The following relationships set forth the conditions that prevent this from happening.

$$d < D \frac{B}{n} \tag{2}$$

and $$F \leq \gamma_{FA} D \tag{3}$$

where B is a relative surface energy constant, n is the number of capillaries in the porous material, F is the force on the chip, $\gamma_{FA}$ is the fluid-atmosphere surface energy, and D is the diameter of the cooling element.

Yet another requirement is that the liquid will remain in the porous material and in the device-cooling element gap during accelerations greater than that of gravity. A major assumption is that the critical size of a liquid drop to separate from the porous material includes all the energy in the capillary. Using a system energy approach, the following relationship predicts the maximum acceleration capability of the system as a function of the porous material capillary length and diameter, a liquid surface energy to density ratio and system relative wettability;

$$a < 2 \frac{\gamma}{p} \frac{A(d^2 l)^{\frac{2}{3}} + Bdl - Cd^2}{d^2 l^2} \tag{4}$$

where a is the maximum acceleration, $\gamma/p$ is the surface energy to density ratio of the liquid, d is the porous material capillary diameter, l is the porous capillary length, and A, B and C are relative surface energy constants.

Typical liquids that can be used in the practice of this invention are metals having a melting point at or below room temperature such as gallium, indium, mercury and alloys thereof. Various organic liquids can also be used such as transformer oils. Also silicon oils such as Dow Corning 200 fluid can be useful. In general the liquid used in the practice of the invention must have a low vapor pressure and satisfy the aforementioned criteria set forth in the various relationships.

The porous material which can be used in the practice of the invention can be any suitable material which also satisfies the aforementioned criteria taken with the selected liquid. Typical materials are pressed metal wire randomly arranged, pressed metal wire that is axially aligned, sintered particulate ceramic or metal particles.

The metal wire must be inert to the liquid or it should be coated with a material that is inert to the liquid. The refractory metals such as tungsten and molybdenum are particularly suited for this application and generally need not be coated. In general copper, gold, silver and other face-centered cubic metals are unsuitable as they alloy with gallium. However if these metal wires are coated with an inert metal such as chromium they have potential useage. It is desirable that the metal selected for forming the porous material be a good thermal conductor. The refractory metals have a relatively poor thermal conductivity but are relatively inert. These metals can be made into porous material by molding the particulate metal to the desired shape and subsequently sintering. However the aforementioned metals may be perfectly satisfactory with the transformer oil or silicon oils previously discussed.

The gap between the device and the cooling element, i.e. the porous material must be relatively small to avoid the problems discussed previously. With liquid metals the gap can be of the order of 30 mils. However with the organic and silicon liquids the gap will ordinarily be less i.e. on the order of 15 mils. Because of its low $\gamma/p$ ratio, silicon oil may not be used for systems having device to cooling element gaps greater than 0.005 inch. Since this is not ordinarily within the manufacturing tolerances of a rigid piston design, a spring loaded design, such as illustrated in FIG. 2, is necessary to assure positive piston to cooling element contact. Since tension in the liquid is no longer a problem with a positive contact, surface energy density criteria in the second correlation can be ignored and a sintered-metal piston design becomes feasible. The porous tip will provide silicon oil which would bridge the gap between the device and cooling element in any area where positive contact was not available due to device misalignment.

While we have illustrated and described the preferred embodiments of our invention it is to be understood that we do not limit ourselves to the precise construction herein disclosed and the right is reserved to all changes and modifications coming within the scope of the invention as defined by the appended claims.

Having thus described my invention, what I claim as new, and desire to secure by Letters Patent is:

1. In a semiconductor device package having a substrate, at least one semiconductor device mounted on the top surface of the substrate, a heat sink having a surface in spaced relation to the top surface of the substrate, the improvement comprising,
   at least one heat transfer member positioned between said device and said surface of said heat sink,
   said heat transfer member comprised of a porous block of material, and
   a heat conductive non-volatile low viscosity, high surface tension, liquid permanently retained within said block of material and in contact with said device by capillary action,
   said heat transfer member operative to transfer heat by conduction from said device to said heat sink without changing phase.

* * * * *